United States Patent [19]

Davies

[11] Patent Number: 4,521,799
[45] Date of Patent: Jun. 4, 1985

[54] CROSSUNDER WITHIN AN ACTIVE DEVICE

[75] Inventor: Robert B. Davies, Tempe, Ariz.

[73] Assignee: Motorola, Inc., Schaumburg, Ill.

[21] Appl. No.: 453,405

[22] Filed: Dec. 27, 1982

[51] Int. Cl.³ .................... H01L 27/2; H01L 29/72; H01L 27/4
[52] U.S. Cl. ..................................... 357/51; 357/48; 357/35; 357/36
[58] Field of Search .................... 357/51, 48, 35, 36

[56] References Cited

U.S. PATENT DOCUMENTS

| 3,295,031 | 12/1966 | Schmitz | 357/20 |
| 3,443,176 | 5/1969 | Agusta et al. | 357/48 |
| 3,581,165 | 5/1971 | Seelbach et al. | 357/48 |
| 3,990,092 | 11/1976 | Yoshimura | 357/51 |
| 4,223,335 | 9/1980 | Kane | 357/51 |

OTHER PUBLICATIONS

Flaker and Moore, "Transistor Underpass," *IBM Tech. Discl. Bulletin,* vol. 13, No. 5, Oct. 1970.
Hershman, "Use of Emitter in an Unused Transistor as an Underpass," *IBM Tech. Discl. Bulletin,* vol. 14, No. 4, Sep. 1971.
Geller and Lewis, "Floating Voltage Line Underpass," *IBM Tech. Discl. Bulletin,* vol. 14, No. 9, Feb. 1972.
Price and Wolf, "Nt Multiple Underpass Device," *IBM Tech. Discl. Bulletin,* vol. 19, No. 7, Dec. 1976.

*Primary Examiner*—Andrew J. James
*Assistant Examiner*—E. Fallick
*Attorney, Agent, or Firm*—Robert M. Handy

[57] ABSTRACT

A low impedance crossunder region is formed of a low resistivity emitter diffusion within a base region of an active device which extends beneath a portion of a metallization pattern to be crossed. The low resistivity crossunder diffusion is shorted to the base region in order to prevent transistor action between the crossunder region and the base region in contrast with other emitter diffusions within the base region which form diode junctions with the base region.

17 Claims, 3 Drawing Figures

CROSSUNDER WITHIN AN ACTIVE DEVICE

BACKGROUND OF THE INVENTION

The present invention pertains in general to low impedance crossunders and in particular to low impedance crossunders within an active device.

Planar technology is most commonly used in the fabrication of integrated circuits. In this technology, the devices and components forming the integrated circuit extend below the surface of one plane of a silicon substrate. The devices and components are formed by selected diffusion of dopants into the substrate, each dopant creating a region of a characteristic conductivity type in the volume into which it diffuses. In order to control the zones of diffusion of the dopant, the layer of silicon to be treated is first covered by a layer of silicon dioxide, $SiO_2$. The silicon dioxide is then coated with a photosensitive material known as the photoresist which may, for example, polymerize and harden in the presence of ultraviolet light. A photographic negative of a pattern of desired windows to be etched in the $SiO_2$ layer is placed on the surface of the photoresist and ultraviolet light is shined through the negative to harden the photoresist except in those areas covered by the window pattern. After removing the negative and dissolving the unexposed portions of the photoresist, the $SiO_2$ layer is etched away in those areas not covered by the hardened photoresist by exposure to a buffered solution of hydrofluoric acid in order to provide a pattern of exposed portions of the layer to be doped beneath the $SiO_2$. A dopant tending to produce a region of a desired conductivity type is then diffused into the layer through the window. This process is repeated as often as is required to produce the desired number and pattern of regions of different conductivity types. Finally, the layer of $SiO_2$ is formed on the external surface of the plane of the silicon substrate through which insulating layer preohmic windows are etched to delimit electrical contact portions. A metallization pattern is then deposited on the surface of the insulating $SiO_2$ layer and through the preohmic windows to make electrical contact with the diffused regions.

It is common to have an integrated circuit in which at least some of the plurality of the conductors formed by the pattern of metallization must cross in order to form a desired connection between devices and components in the integrated circuit.

One approach to providing crossings for conductors on the surface of an integrated circuit involves the formation of a first region of a first conductivity type surrounded by a second region of a second conductivity type, both of which pass beneath the $SiO_2$ layer which is in turn below the conductor to be crossed. A crossunder is formed which may be electrically connected to a metallization pattern on both sides of a conductor to be crossed. By electrically shorting the two regions, transistor action between the two layers is prevented. In this approach, crossunders are isolated from one another and from active devices being surrounded by a region of the first conductivity type. However, as integrated circuit dimensions have shrunk, less of the area of an IC chip may be practically devoted to crossunders of this type. Furthermore, with decreased IC dimensions a need has already arisen for providing a low impedance connection between contacts to an active device on both sides of a conductor passing over the active device.

SUMMARY OF THE INVENTION

Accordingly, it is an object of the present invention to provide a new and improved low impedance crossunder.

It is a further object of the present invention to provide a new and improved active device structure having contacts on either side of a portion of a metallization pattern.

Yet another object of the present invention is to provide a new and improved integrated circuit having crossunders within active devices.

Among the advantages of the present invention are a reduction in the amount of chip area which needs to be devoted to crossunders and a lower impedance path for connecting contact portions within an active device than is otherwise available.

These and other objects and advantages of the present invention will become apparent to those skilled in the art upon consideration of the accompanying specification, claims and drawings.

In order to attain the above-mentioned and other objects and advantages, the apparatus of the present invention involves a low impedance crossunder within a body of semiconductor material having at least a first surface, having at least a first layer and being surmounted by a metallization pattern. The low impedance crossunder comprises an insulating layer covering the first surface of the semiconductor material beneath the metallization pattern and above a first region of a first conductivity type within the first layer at the surface of the semiconductor material. The crossunder further comprises a second region of the first conductivity type and a region of a second conductivity type within the first layer, surrounding the first region of the first conductivity type and the second region of the first conductivity type, being shorted to the first region of the first conductivity type and forming a diode junction with the second region of the first conductivity type.

DESCRIPTION OF THE PREFERRED EMBODIMENTS

Figure 1:
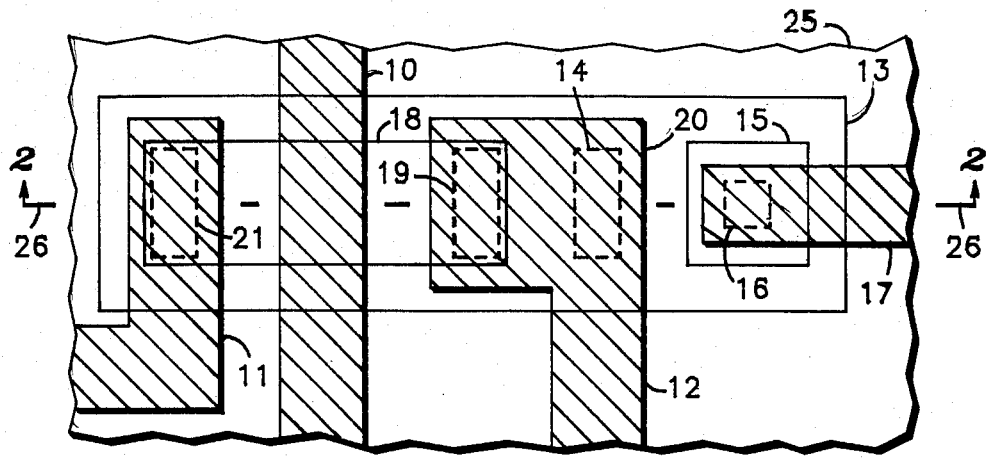
FIG. 1 is a planar view of a first embodiment of the present invention.

In a portion of an integrated circuit, as shown in FIG. 1, a first conductor 10 passes between a second conductor 11 and a third conductor 12 and over a transistor having a base 13. Base 13 has preohmic contact portion 14 and surrounds an emitter 15. Emitter 15 has a preohmic contact portion 16 which is electrically connected to a conductor 17. Conductor 17 serves as the emitter lead for a transistor just as conductor 12, which is an electrical contact with base 13 at preohmic contact portion 14, serves as a base lead for the same transistor.

A crossunder 18 of emitter material has a first preohmic contact portion 19 in electrical contact with conductor 12. Conductor 12 has a widened portion 20 which serves to create an electrical short circuit between contact portion 14 of base 13 and contact portion 19 of crossunder 18. Crossunder 18 has a second preohmic contact portion 21 which is in electrical contact with conductor 11 on a side of conductor 10 opposite to that of preohmic contact portion 19. A controller region 25 surrounds base 13, emitter 15 and crossunder 18 and lies beneath conductors 10, 11 and 12.

Figure 2:
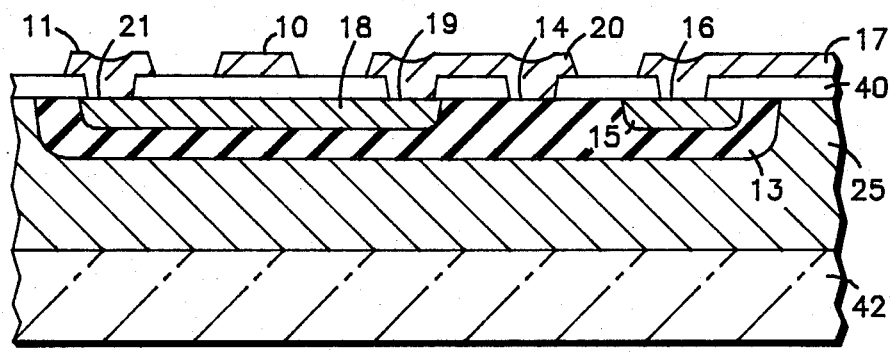
FIG. 2 is a schematic sideview, in cross-sectional form, of the device of FIG. 1.

A better understanding of the embodiment of FIG. 1 can be gained from an examination of the cross-section of FIG. 2 which is cut along line 26 of FIG. 1 and wherein structures which are shown in FIG. 1 are identified by the numerals used to refer to them in FIG. 1. An n− epitaxial layer is ground on a p− substrate 42 to provide a collector region 25. Following surface oxidation, masking and etching, a p-type diffusion is used to create a base region 13 and an n+-type diffusion is used to create both an emitter region 15 and a crossunder region 18 within base 13. An $SiO_2$ oxidation layer 40 is grown on all of collector region 25, base region 13, crossunder region 18, and emitter region 15. Preohmic windows are etched in oxidation 40 to delimit an emitter preohmic contact portion 16, a base preohmic contact portion 14, a first crossunder preohmic contact portion 19, a second preohmic contact portion 21.

A portion of a metallization pattern 17 is deposited on the surface of oxidation 40 and through the preohmic window above portion 16 to make contact with emitter 15. A second portion of the metallization pattern is deposited on the surface of oxidation 40 and through the preohmic windows above portions 14 and 19 to make contact with base 13 and with crossunder 18 respectively. Likewise, a third portion of the metallization pattern is deposited on the surface of oxidation 40 to form a conductor 10 passing over the region of crossunder 18 and passing between widened portion 20 of conductor 12 and a fourth portion 11 of a metallization pattern which is also deposited on the surface of oxidation 40 and which passes through the preohmic window above portion 21 to make electrical contact with crossunder 18.

As is understood by one skilled in the art, from consideration of FIG. 2, where it is desirable to make contact with an active device on opposite sides of an intervening conductor, the use of a low resistivity diffusion, in the form of a highly doped region such as the n+ region of FIG. 2, provides a crossunder having less impedance between conductors 11 and 12 than if higher resistivity P-type base diffusion were used as the crossunder. In this sort of situation it is desirable to have the impedance between contacts made to a region of a transistor be as low as possible and a typical value calculated for the present invention is 10 ohm/square versus 125 ohm/square for the same path through base region 13 in the absence of low resistivity region 18.

One skilled in the art also understands that crossunder 18 is isolated from emitter region 15 by base region 13 and that by shorting crossunder 18 to base region 13 through portion 20 of conductor 12 no transistor action can occur between and no diode junction is formed between region 18 and region 13. On the other hand, region 15 does form a diode junction with base 13 and transistor action does occur between these two regions so that base 13 serves both as the base region for a transistor including emitter 15 and collector 25 and as an isolation region for crossunder 18.

Furthermore, it is obvious to one skilled in the art from examination of FIG. 2 that the increased interconnect capability of the present invention is achieved despite the fact that less die area need be expended than if crossunder 18 had been isolated in a base diffusion separate from region 13 as found in the prior art.

Figure 3:
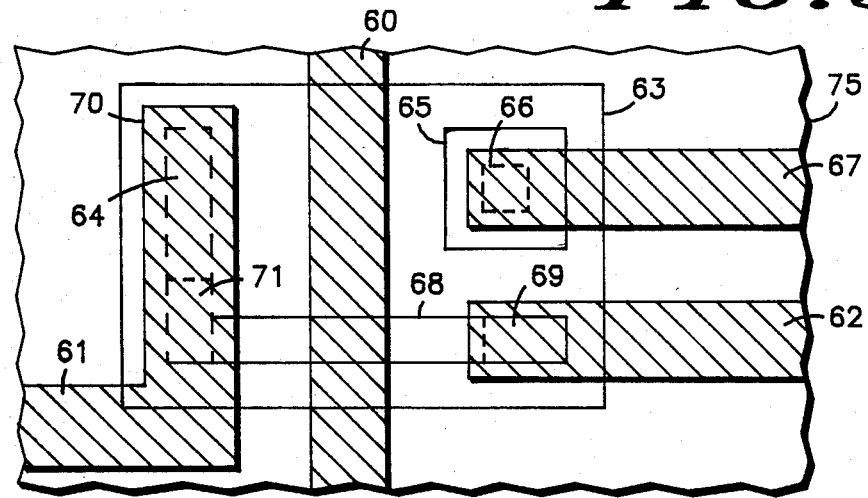
FIG. 3 is a planar view of a second embodiment of the present invention.

While the present invention has been described in terms of a preferred embodiment, further modification and improvements will occur to those skilled in the art. For example, although the present invention has been described in terms of a particular planar structure, other planar structures may be employed to advantage according to present invention. For example, as shown in FIG. 3 a first conductor 60 crosses between a second conductor 61 and a third conductor 62 over a base region 63 of an active device. Base region 63 has a preohmic contact portion 64. Base region 63 surrounds an emitter diffusion region 65 which has a preohmic contact portion 66 in electrical contact with a third conductor 67. A second low resistivity emitter diffusion 68 has a first preohmic portion 69 in electrical contact with conductor 62 on a first side of conductor 60 and has a second preohmic contact portion 71 in electrical contact with a widened portion 70 of conductor 61 on a second side of conductor 60. A collector diffusion 75 surrounds base region 63 at the surface of a body of semiconductor material. As is shown in FIG. 3, base preohmic contact portion 64 may be on an opposite side of conductor 60 from emitter preohmic contact portion 66.

Furthermore, although the present invention has been described in terms of a NPN transistor structure, the present invention could be used beneficially to produce other semiconductor structures, such as a PNP device structure.

The present invention could also be beneficially applied to either vertical or lateral transistor elements and could employ other types of conductors, such as doped polysilicon, instead of metal.

I desire it to be understood, therefore, that this invention is not limited to the particular form shown and that I intend in the appended claims to cover all such equivalent variations which come within the scope of the invention as claimed.

I claim:

1. A semiconductor structure comprising:
   a semiconductor substrate having a first surface;
   an active device located in said substrate, extending to said first surface, and having an emitter region, a base region, and a collector region;
   a conductive cross-under, separated from said emitter region and formed in an extension to said base region, having the same conductivity type as said emitter region; and
   a first conductor passing over said cross-under and insulated therefrom.

2. The semiconductor structure of claim 1 further comprising a second conductor connected to one end of said conductive cross-under and to said base region.

3. The semiconductor structure of claim 1 wherein said conductive cross-under has a doping density higher than the doping density of said base region.

4. The semiconductor structure of claim 1 wherein said conductive cross-under has the same doping density as said emitter region.

5. The semiconductor structure of claim 4 wherein said conductive cross-under is formed at the same time as said emitter region.

6. The semiconductor structure of claim 1 wherein said cross-under has a sheet resistance lower than the sheet resistance of said base region.

7. The semiconductor structure of claim 1 wherein said emitter region and said base region are not shorted together.

8. The semiconductor structure of claim 1 wherein at least one end of said cross-under and said base region are shorted together.

9. A semiconductor structure comprising:
a semiconductor substrate;
within said substrate, an active first region of a first conductivity type able to inject carriers into an adjacent second region of a second conductivity type;
within said second region, a third region of said first conductivity type, separated from said active first region;
conductor means crossing over at least a portion of said third region and insulated therefrom; and
shorting means connecting said second and third regions together.

10. The semiconductor structure of claim 9 wherein said first and third regions are formed at the same time.

11. The semiconductor structure of claim 9 wherein said third region has at least two contact portions including a first adapted to receive said shorting means and a second adapted to be contacted by additional conductor means.

12. The semiconductor structure of claim 11 wherein said first, second, and third regions extend to a first surface of said semiconductor substrate, and wherein said first and third regions are surrounded by said second region.

13. An integrated circuit comprising:
a body of semiconductor material having a first surface;
a layer of insulating material on said first surface having therein windows to facilitate electrical contact to portions of said first surface;
a plurality of regions of a first conductivity type extending to said first surface;
at least one region of a second conductivity type different than said first conductivity type surrounding at least two of said plurality of regions of said first conductivity type, wherein a first of said at least two regions is shorted to said second region and a second of said at least two regions is not shorted to said second region;
a first conductor on said insulating layer, passing over a portion of said first of said at least two regions and insulated from said first of said at least two regions;
a second conductor on said insulating layer connected to said first of said at least two regions and insulated from said second of said at least two regions; and
a third conductor on said insulating layer connected to said second of said at least two regions and insulated from said first of said at least two regions.

14. The integrated circuit of claim 13 wherein said at least two regions have the same doping density.

15. The integrated circuit of claim 13 wherein said at least two regions are formed by the same doping step.

16. The integrated circuit of claim 13 wherein said at least two regions have a lower conductivity than said at least one region of said second conductivity type.

17. The integrated circuit of claim 13 wherein said at least two regions have the same depth into said at least one region of said second conductivity type.

* * * * *